United States Patent
Kwon et al.

(10) Patent No.: US 6,770,836 B2
(45) Date of Patent: Aug. 3, 2004

(54) IMPEDANCE MATCHING CIRCUIT FOR INDUCTIVELY COUPLED PLASMA SOURCE

(75) Inventors: Gi-Chung Kwon, Gyeonggi-do (KR); Hong-Sik Byun, Gyeonggi-do (KR); Sung-Weon Lee, Gyeonggi-do (KR); Hong-Seub Kim, Gyeonggi-do (KR); Sun-Seok Han, Gyeonggi-do (KR); Bu-Jin Ko, Daejon (KR); Joung-Sik Kim, Choongchongnam-do (KR)

(73) Assignee: Jusung Engineering Co., Ltd. (KR)

( * ) Notice: Subject to any disclaimer, the term of this patent is extended or adjusted under 35 U.S.C. 154(b) by 183 days.

(21) Appl. No.: 10/100,983

(22) Filed: Mar. 19, 2002

(65) Prior Publication Data

US 2002/0130110 A1 Sep. 19, 2002

(30) Foreign Application Priority Data

Mar. 19, 2001 (KR) ........................................ 2001-14117

(51) Int. Cl.[7] .............................................. B23K 10/00
(52) U.S. Cl. ............................ 219/121.54; 219/121.43; 219/121.4; 156/345.48; 118/723 I
(58) Field of Search ......................... 219/121.43, 121.4, 219/121.41, 121.52, 121.57; 204/298.06, 298.08, 298.11; 315/111.51; 156/345.48; 118/723 I (56) References Cited

U.S. PATENT DOCUMENTS

| | | | |
|---|---|---|---|
| 5,394,061 A | | 2/1995 | Fujii |
| 5,897,713 A | * | 4/1999 | Tomioka et al. .......... 118/723 I |
| 6,083,344 A | * | 7/2000 | Hanawa et al. ............. 156/345 |
| 6,264,812 B1 | * | 7/2001 | Raaijmakers et al. .. 204/298.06 |
| 6,441,555 B1 | * | 8/2002 | Howald et al. ......... 315/111.51 |
| 6,531,031 B1 | * | 3/2003 | Becker et al. ......... 156/345.48 |

FOREIGN PATENT DOCUMENTS

| | | |
|---|---|---|
| KR | 1997-3608 | 1/1997 |
| WO | WO 00/00993 | 1/2000 |

OTHER PUBLICATIONS

U.S. Pub. No. US2002/0002947 A1, Pub. Date: Jan. 10, 2002 for *"Inductive Coupling Plasma Processing Apparatus"*.

* cited by examiner

Primary Examiner—Mark Paschall
(74) Attorney, Agent, or Firm—Duane Morris LLP (57) ABSTRACT

An impedance matching circuit for a plasma source includes: a first network including: a first coil; and a RF power supply applying a first voltage to the first coil; and a second network including; a second coil grounded having a second voltage, the second voltage being lower than the first voltage; first and second reactive elements, one end portion of the first and second reactive elements being connected to each end portion of the second coil, respectively; and a load connected to the other end portions of the first and second reactive elements, phases at two end portions of the load being different from each other.

16 Claims, 6 Drawing Sheets

IMPEDANCE MATCHING CIRCUIT FOR INDUCTIVELY COUPLED PLASMA SOURCE

This application claims the benefit of Korean Patent Application No. 2001-14117, filed on Mar. 19, 2001, which is hereby incorporated by reference.

BACKGROUND OF THE INVENTION

1. Field of the Invention

This invention relates to a plasma source. More particularly, it relates to an impedance matching circuit of a plasma source that generates inductively coupled plasma.

2. Discussion of the Related Art

Technology of deposition and etching using plasma is applied to a field of fine treatment and has rapidly improved. Recently, a requirement for a plasma processor is increasing according to an increase of resolution and size in a field of a semiconductor. Accordingly, a research to generate plasma of high efficiency, i.e., plasma having a uniform concentration under lower pressure and wider area, has been performed.

Of various methods of generating plasma, a method of generating inductively coupled plasma (ICP) using a high frequency power supply such as a radio frequency (RF) power supply is to generate and maintain plasma by generating a time-varying electric field due to the RF power supply and exciting gases due to the time-varying electric field. The method of generating ICP has several advantages in contrast with a method of generating capacitively coupled plasma (CCP) that has been widely used. That is, the processing pressure is lower, the concentration of plasma is higher, the structure of apparatus for the method has lower limitations and plasma is directly used for the reaction due to the generation of plasma on the object.

Figure 1:
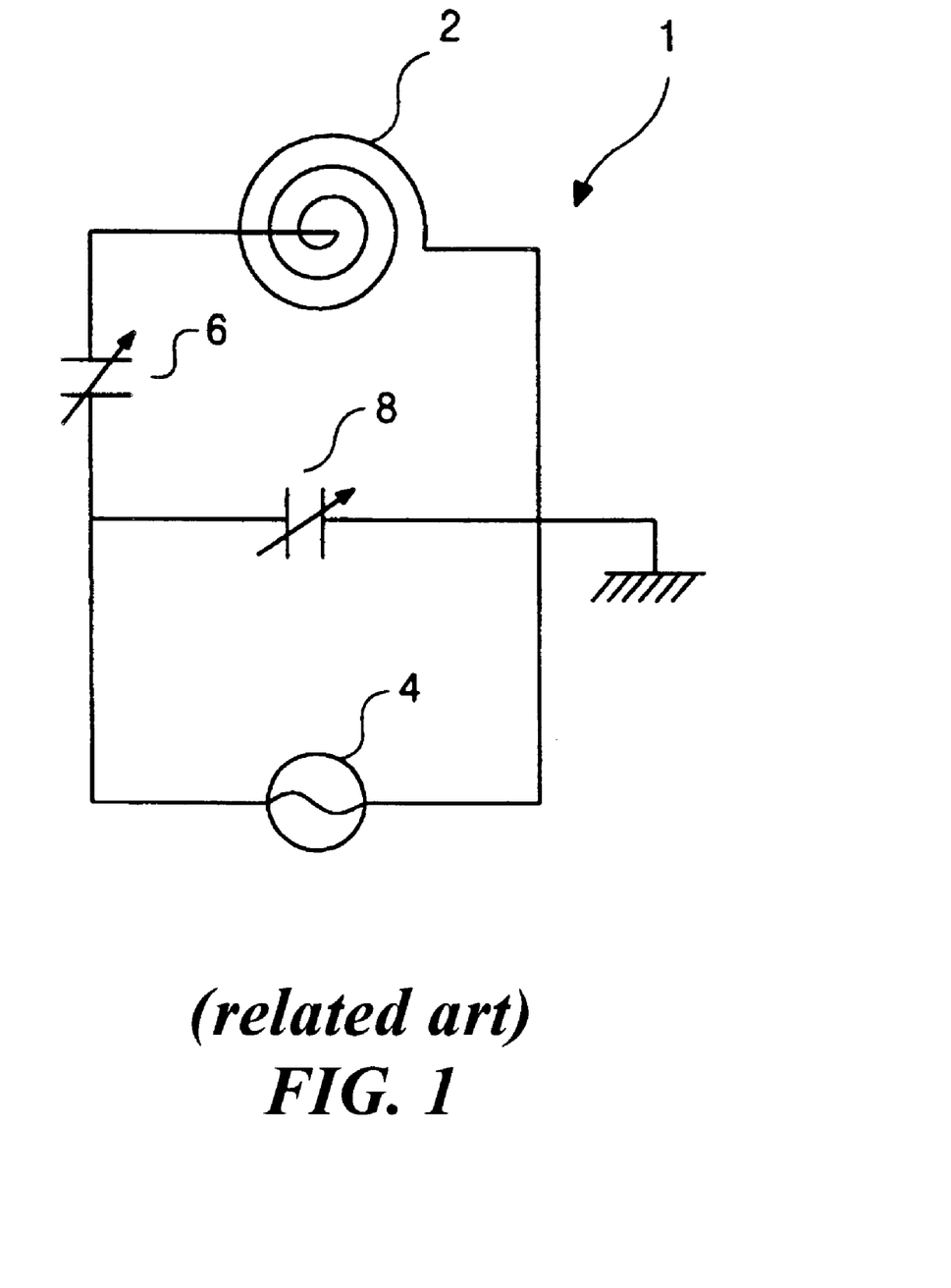
FIG. 1 is a schematic diagram showing an impedance matching circuit of a conventional ICP source.

FIG. 1 is a schematic diagram showing an impedance matching circuit of a conventional ICP source.

In FIG. 1, the impedance matching circuit 1 has a load 2 generating an electric field and a RF power supply 4 applying a high frequency power to the load 2. To transfer the maximum power from the RF power supply 4 to the load 2, a plurality of matching elements 6 and 8 are included. Inductors, capacitors or reactors, i.e., combination of the inductors and capacitors can be used as the matching element. A coil of conductive material can be used as the load 2 to concentrate the electric field. The impedance matching circuit 1 of a conventional ICP source having a plurality of elements can have shape of L, T or π. Furthermore, the conventional ICP source including the impedance matching circuit can be applied to the various processes for fabrication of semiconductor as a plasma source. For example, the conventional ICP source can be used for a plasma etching apparatus in which a deposited thin film on a substrate is etched.

Figure 2:
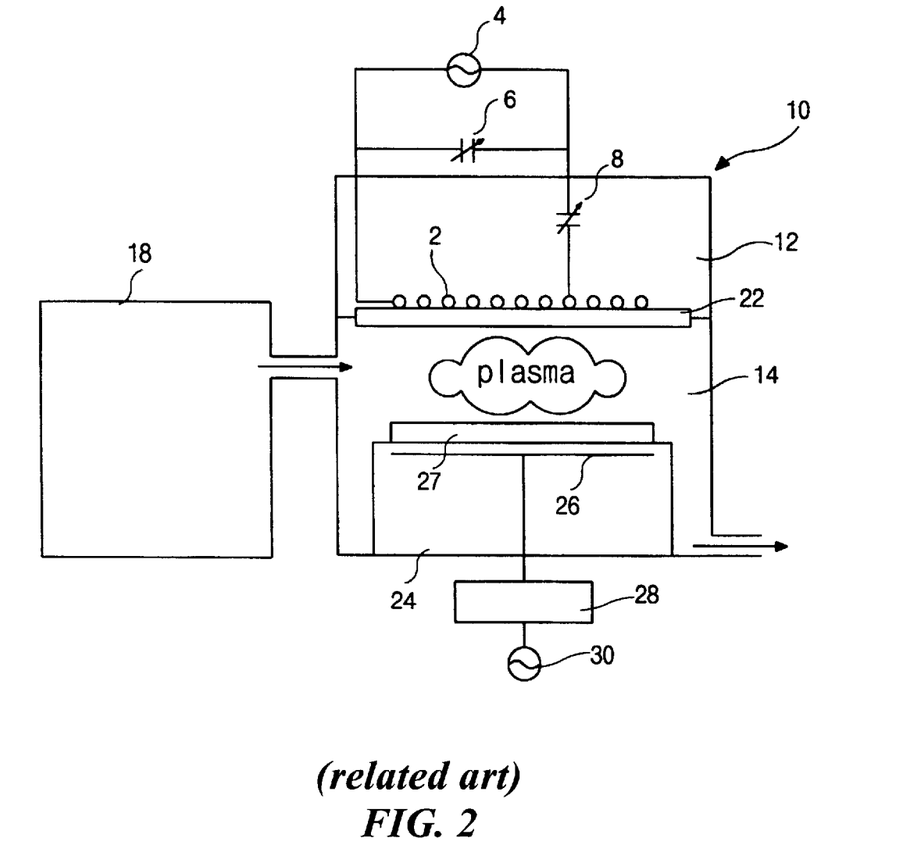
FIG. 2 is a schematic diagram showing a plasma etching apparatus having a conventional ICP source.

FIG. 2 is a schematic diagram showing a plasma etching apparatus having a conventional ICP source.

In FIG. 2, the plasma etching apparatus includes a chamber 10 and a gas supply part 18. A direct process for a substrate is performed in the chamber 10, and the gas for the process is contained in the gas supply part 18 and is supplied to the chamber 10. In the chamber 10, an insulating plate 22 of a material such as ceramic, silicon carbide (SiC) or quartz. The chamber 10 is divided into first and second regions 12 and 14, which are plasma generating source and plasma generating bias regions, respectively. A load 2 of an impedance matching circuit of a ICP source generating an electric field by a power supplied from a RF power supply 4 is disposed in the first region 12. Furthermore, a substrate table 24 is disposed in the second region 14. Especially, a bias electrode 26 is disposed in the substrate table 24 to adjust impact energy of plasma ion. The bias electrode 26 includes an independent RF power supply 30 different from the RF power supply 4 of ICP source and an impedance matching circuit 28.

In the process for the substrate, gas such as argon (Ar), helium (He), hydrogen ($H_2$) or nitrogen ($N_2$) is injected into the chamber 10 through the gas supply part 18 and an impedance matched voltage of high frequency is applied to the load 2 of plasma source in the first region 12 through the reactive elements 6 and 8, thereby a magnetic field being generated in the chamber 10. The magnetic field is extended to the second region 14 of the chamber 10 through the insulating plate 22 and induces an electric field, thereby the electric field exciting the injected gas to plasma state. Then, the etching process of the substrate is performed with the plasma in the second region 14.

However, the etching process using a conventional ICP source having the impedance matching circuit 1 has some problems. Since the load 2 of plasma source has a shape of helix, the intensity of the induced electric field and the generated plasma are concentrated on the center of the load 2. The non-uniformity of the plasma concentration makes the etching results non-uniform and the reliability of the device is reduced. Furthermore, since the voltage of the load 2 is higher than that of plasma, i.e., sheath voltage, a sputtering phenomenon happens at the insulating plate 22. That is, the load 2 induces a time-varying electric field by the high frequency power applied from the RF power supply and the injected gas is excited by the induced electric field to be a plasma ion with high velocity. Generally, since the induced electric field is more intensive than an electric field by the sheath voltage, the plasma ion is accelerated to the insulating plate 22. Therefore, the plasma ion collides with and permeates into the insulating plate 22, thereby a sputtering phenomenon that the molecule of the insulating plate 22 is ejected by a chain collision of the molecule and the permeated plasma ion happening. Since the ejected molecule of the insulating plate 22 functions as an impurity particle and contaminates the chamber 10, the reliability and the production yields of the device are reduced.

The said problems, i.e., the non-uniform plasma by the non-uniform electric field and the undesirable sputtering by the plasma also happen in all kinds of chamber type apparatus using the conventional ICP source such as plasma enhanced chemical vapor deposition (PECVD) apparatus or surface treatment apparatus for metal or polymer. Therefore, the usage of the conventional ICP source has limitation. Especially, the said problems of a dry etching apparatus are more serious than those of a PECVD apparatus.

SUMMARY OF THE INVENTION

Accordingly, the present invention is directed to an inductively coupled plasma source that substantially obviates one or more of the problems due to limitations and disadvantages of the related art.

To overcome the problems described above, the present invention provides an inductively coupled plasma source that generates plasma having a uniform concentration and prevents an undesired sputtering phenomenon.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other objects and in accordance with the purpose of the present invention, as embodied and broadly described, an impedance matching circuit for a plasma source includes: a first network including: a first coil; and a RF power supply applying a first voltage to the first coil; and a second network including; a second coil grounded having a second voltage, the second voltage being lower than the first voltage; first and second reactive elements, one end portion of the first and second reactive elements being connected to each end portion of the second coil, respectively; and a load connected to the other end portions of the first and second reactive elements, phases at two end portions of the load being different from each other.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to embodiments of the present invention, which are illustrated in the accompanying drawings. Wherever possible, the same reference numbers will be used throughout the drawings to refer to the same or like parts.

Figure 3:
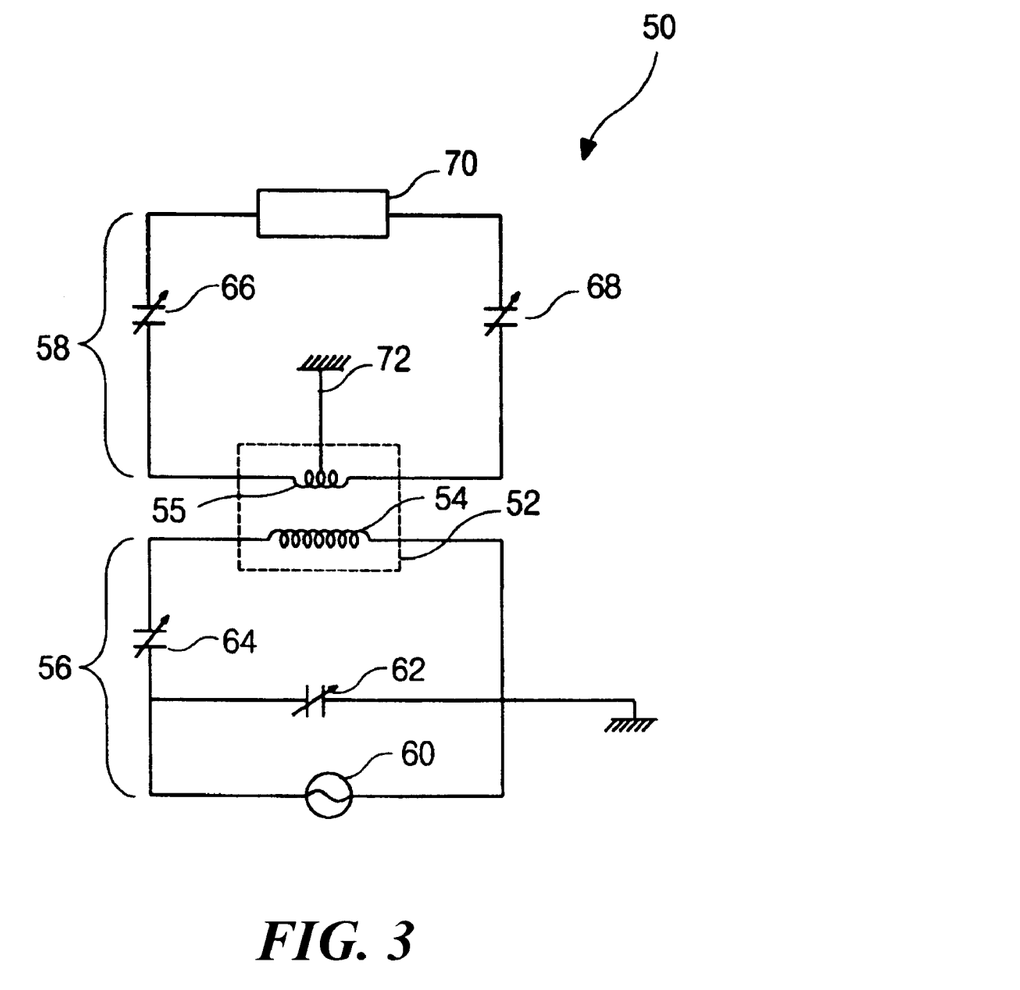
FIG. 3 is a schematic diagram showing an impedance matching circuit of an ICP source according to the present invention.

FIG. 3 is a schematic diagram showing an impedance matching circuit of an ICP source according to the present invention.

In FIG. 3, the impedance matching circuit 50 has a symmetric insulating transformer 52 so that the impedance matching circuit 50 can be divided into first and second network 56 and 58 having first and second coils 54 and 55 of the symmetric insulating transformer 52, respectively.

The first network 56 includes the first coil 54 of the symmetric insulating transformer 52, an RF power supply 60 and a plurality of reactive elements 62 and 64, in which the RF power supply 60 applies a first voltage having RF frequency to the first coil 54 and the plurality of reactive elements 62 and 64 can be disposed between the RF power supply 60 and the symmetric insulating transformer 52 for impedance matching. The first network 56 can be grounded for the current flow and the RF power supply 60 can apply the first voltage having a frequency within a range of high frequency (HF) to very high frequency (VHF), i.e., 100 kHz to 300 MHz. Moreover, inductors, capacitors or a combination of inductors and capacitors can be used as the plurality of reactive elements 62 and 64. For example, third and fourth variable capacitors 62 and 64 can be connected to the RF power supply parallel and in series, respectively.

The second network 58 includes the second coil 55 of the symmetric insulating transformer 52, a load 70 and a plurality of reactive elements 66 and 68, in which the second coil 55 applies a second voltage to the load 70, and the plurality of reactive elements 66 and 68 are disposed between the second coil 55 and the load 70 and symmetrically connected in series. Especially, the second coil 55 can be grounded at its midpoint and capacitors can be used as the plurality of reactive elements 66 and 68. The plurality of reactive elements 66 and 68 are variable to adjust the phase of applied voltage and current. For example, first and second variable reactive elements 66 and 68 can be connected to two end portions of the load 70, respectively.

In the ICP source 50 of FIG. 3, the first voltage is applied to the first coil 54 of the symmetric insulating transformer 52 through third and fourth variable reactive elements 62 and 64 of the first network 56 for impedance matching. Then, the first voltage induces a second voltage of a second coil 55. In the symmetric insulating transformer 52, the relation of first and second voltages is determined by the following equation.

$$V1/V2=N1/N2,$$

where V1 is the first voltage of the first coil 54, V2 is the second voltage of the second coil 55, N1 is the number of turns of the first coil 54 and N2 is the number of turns of the second coil 55.

Therefore, the second voltage V2 can be made lower than the first voltage V1 by making the number of turns N2 of the second coil 55 lower than the number of turns N1 of the first coil 54.

Since the second coil 55 has a ground line 72 at its midpoint, the second voltage V2 can be distributed into halves of the second voltage V2 at both ends of the second coil 55. Moreover, even though a power of the first coil is the same as that of the second coil in an ideal symmetric insulating transformer, the power of the second coil is lower than an half power of the first coil due to the energy loss of about 20 to 30% in an real symmetric insulating transformer. After the phase and magnitude of the distributed voltage are changed by first and second variable reactive elements 66 and 68, the distributed voltage is applied to the load 70.

The voltage of the RF power supply 60 is reduced by the symmetric insulating transformer 52 and the reduced voltage is distributed into its halves by the ground line 72 of the second coil 55. Therefore, the applied voltage to the load 70 is outstandingly reduced so that the undesirable sputtering phenomenon can not occur in the vacuum chamber.

To focus the electric field, a coil of concentric circular shape is used as the load 70 of the second network 58. Since a capacitor is used as the first and second variable reactive elements 66 and 68, the second network 58 becomes an LC resonant circuit and the distribution of electric field generated from the load 70 becomes uniform by controlling the current through the first and second variable reactive elements 66 and 68. The ICP sources according to four embodiments of the present invention will be illustrated in detail according to the shape of load 70.

First Embodiment

Figure 4:
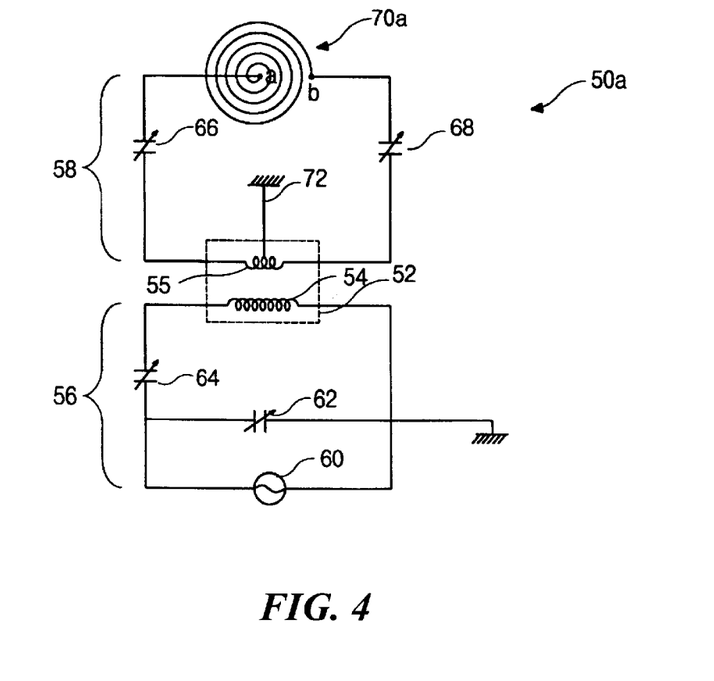
FIG. 4 is a schematic diagram of an ICP source according to a first embodiment of the present invention.

FIG. 4 is a schematic diagram of an ICP source according to a first embodiment of the present invention.

In FIG. 4, a helical coil 70a of one conductive material is used as a load of the impedance matching circuit 50a. A first and second variable reactive elements 66 and 68 are connected to both ends of the second coil 55, respectively. The other ends of the first and second variable reactive elements 66 and 68 are connected to both ends "a" and "b" of the helical coil 70a of one conductive material, respectively. Especially, if phases of input voltages to the first and second variable reactive elements 66 and 68 are same, output voltages have same magnitudes and opposite phases. Therefore, the RF voltages applied to both ends "a" and "b" of the helical coil 70a have same magnitudes and opposite phases so that a neutral point whose potential is 0 can be formed between both ends "a" and "b".

In the ICP source according to the first embodiment of the present invention, the output voltage from the RF power supply 60 is reduced by the insulating transformer 52 and the transformed voltage is distributed into its halves by the ground line 72 at the midpoint of the second coil 55. Accordingly, since the remarkably low voltage is applied to the load 70a, the undesirable sputtering phenomenon seldom occurs. Moreover, the plasma of more uniform concentration distribution can be formed by controlling the neutral point through the first and second variable reactive elements 66 and 68.

Second Embodiment

Figure 5:
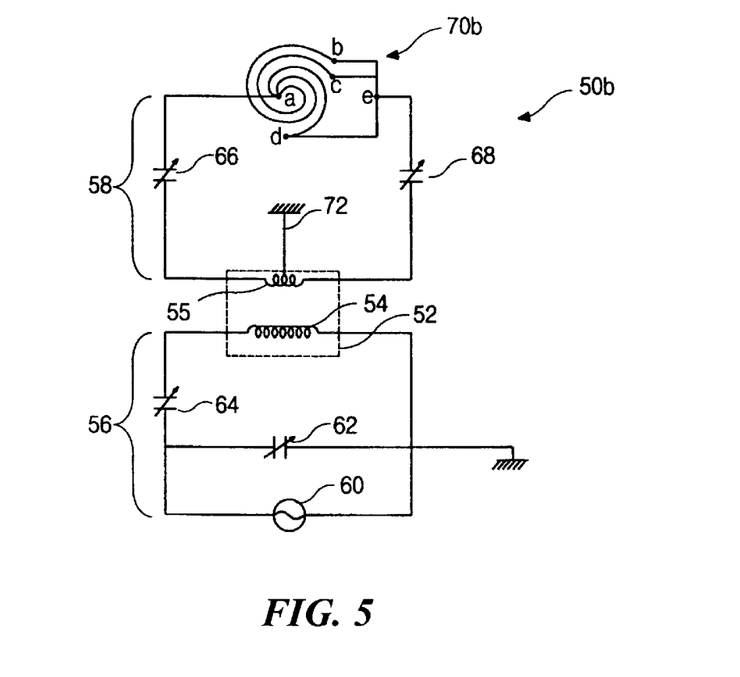
FIG. 5 is a schematic diagram of an ICP source according to a second embodiment of the present invention.

FIG. 5 is a schematic diagram of an ICP source according to a second embodiment of the present invention.

In FIG. 5, a plurality of helical coils 70b connected parallel to a second coil 55 is used as a load of the impedance matching circuit 50b. At ends of first and second variable reactive elements 66 and 68, the load is divided into at least three lines of helical shape. The at least three helical lines have same length, the thickness and the resistivity. If phases of input voltages to the first and second variable reactive elements 66 and 68 are same, output voltages have same magnitudes and opposite phases. In the ICP source according to the second embodiment of the present invention, the output voltage from the RF power supply 60 is reduced by the insulating transformer 52 and the transformed voltage is distributed into its halves by the ground line 72 at the midpoint of the second coil 55. Then, through the first and second variable reactive elements 66 and 68, the distributed voltages are applied to both ends "a" and "e" of the load 70b, respectively. Since the plurality of helical coils are connected parallel to the first and second variable reactive elements 66 and 68, a plurality of neutral points, whose potentials are 0, are formed between "a" and "b", "a" and "c" and a and "d", respectively. Therefore, the positions of the plurality of neutral points can be adjusted by controlling the first and second variable reactive elements 66 and 68, thereby the concentration distribution of the generated plasma being uniform.

Third Embodiment

Figure 6:
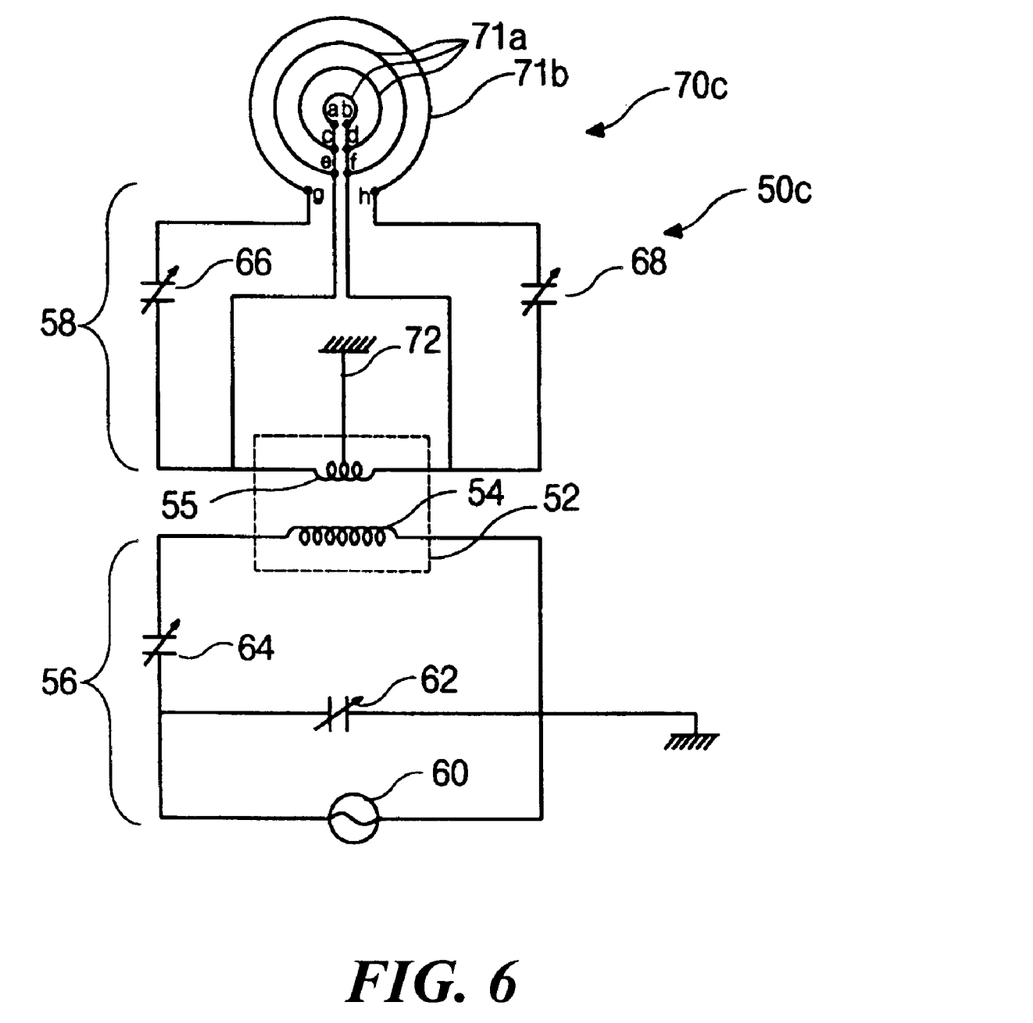
FIG. 6 is a schematic diagram of an ICP source according to a third embodiment of the present invention.

FIG. 6 is a schematic diagram of an ICP source according to a third embodiment of the present invention.

In FIG. 6, a plurality of inner and outer open circles are used as a load of the impedance matching circuit 50c. The load includes a plurality of inner open circles 71a and an outer open circle 71b. Both ends "a" and "b", "c" and "d", and "e" and "f" of the plurality of inner open circles 71a are connected to both ends of the second coil 55 of the symmetric insulating transformer 52, respectively. Both ends "g" and "h" of the outer open circle 71b are connected to ends of first and second variable reactive elements 66 and 68, respectively. Since a low voltage is applied to the plurality of inner open circles 71a and the outer open circle 71b by the symmetric insulating transformer 52 and the ground line 72, an undesirable sputtering does not occur at the load of impedance matching circuit 50c. Moreover, since the outer open circle 71b, and the first and second variable reactive elements 66 and 68 make an LC resonant circuit, a high current can be achieved at the outer open circuit 71b by controlling the first and second variable reactive elements 66 and 68. Therefore, the current density of the plurality of inner open circles 71a is distributed so that the concentration distribution of the generated plasma can be uniform and adjusted.

Fourth Embodiment

Figure 7:
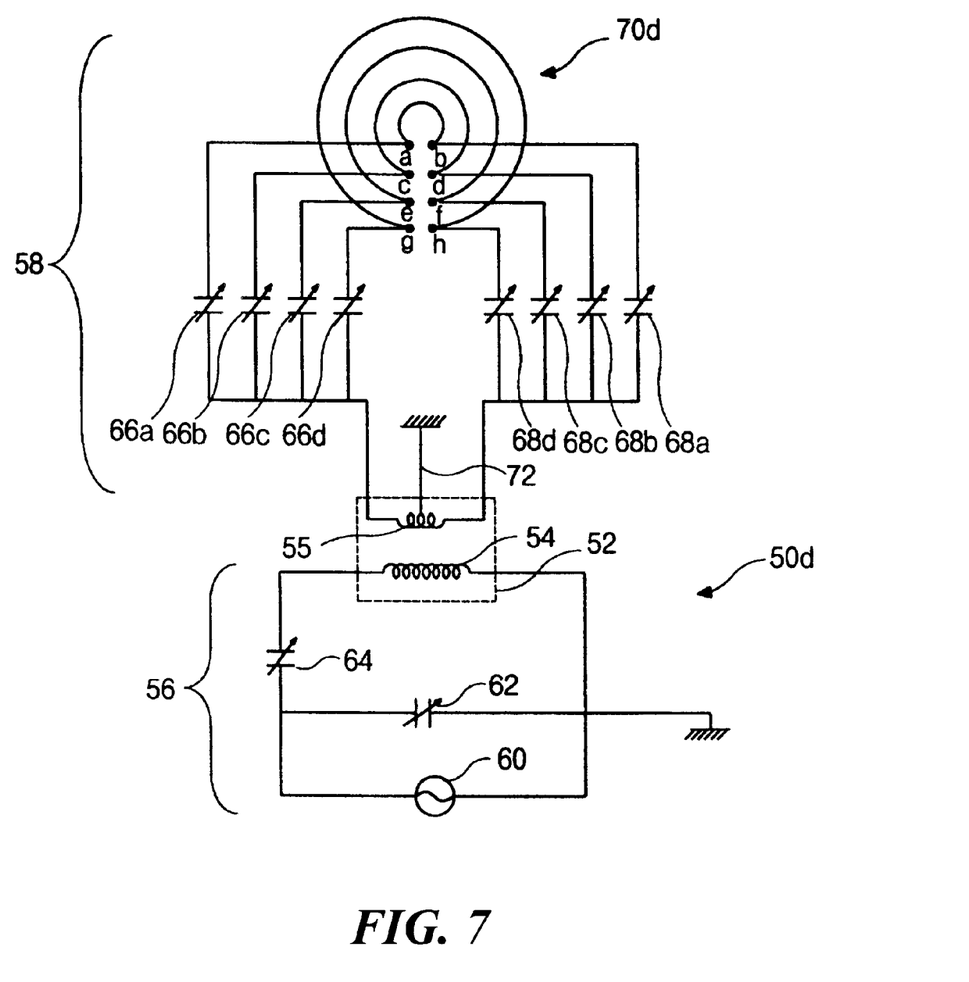
FIG. 7 is a schematic diagram of an ICP source according to a fourth embodiment of the present invention.

FIG. 7 is a schematic diagram of an ICP source according to a fourth embodiment of the present invention.

In FIG. 7, a plurality of open circles 70d are used as a load of the impedance matching circuit 50c. The first and second variable reactive elements include a plurality of first and second sub-reactive elements 66a, 66b, 66c and 66d, and 68a, 68b, 68c and 68d, connected parallel to the second coil 55 of the symmetric insulating transformer 52, respectively. The plurality of open circles 70d are concentric and their radii are different from each other. Since the plurality of open circles 70d and the plurality of first and second sub-reactive elements 66a, 66b, 66c and 66d, and 68a, 68b, 68c and 68d compose a plurality of parallel LC resonant circuits, an individual current of each open circle is controlled by each sub-reactive element so that the concentration distribution of the generated plasma can be uniform Moreover, since the applied voltage is reduced through the symmetric insulating transformer 52 and the ground line 72, an undesirable sputtering is prevented.

Consequently, an ICP source having an impedance matching circuit according to the present invention has advantages in contrast with the conventional art. First, since a remarkably reduced voltage is applied to a load of the impedance matching circuit, an undesirable sputtering is prevented. Second, since a variable reactive element are used for controlling the current of the load of the impedance matching circuit, a concentration distribution of the plasma is uniform. Third, the ICP source has a simple structure and can be applied to all the process using the plasma source.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An impedance matching circuit for a plasma source, comprising:
    a first coil; and
    a RF power supply applying a first voltage to the first coil;
    and a second network, including:
        a second coil grounded having a second voltage, the second voltage being lower than the first voltage;
        first and second reactive elements, one end portion of the first and second reactive elements being connected to each end portion of the second coil, respectively; and a load connected to the other end portion of the first and second reactive elements, phases at two end portions of the load being different from each other.

2. The circuit according to claim 1, wherein the second coil is grounded at a midpoint of the second coil.

3. The circuit according to claim 1, wherein the first voltage has a frequency within a range of 100 kHz to 300 MHz.

4. The circuit according to claim 1, the first network further comprising a voltage adjusting means between the RF power supply and the first coil, the voltage adjusting means adjusting the first voltage.

5. The circuit according to claim 4, wherein the voltage adjusting means are third and fourth reactive elements connected to the RF power supply parallel and in series, respectively.

6. The circuit according to claim 1, wherein the first and second reactive elements are variable capacitors.

7. The circuit according to claim 1, wherein the load has a shape of helix and the other end portions of the first and second reactive elements are connected to two end portions of the load, respectively.

8. The circuit according to claim 1, wherein the load is divided into at least three portions parallel connected to the other end portions of the first and second reactive elements.

9. The circuit according to claim 8, wherein the at least three portions have a shape of helix.

10. The circuit according to claim 1, further comprising first and second line connecting the second coil and the load.

11. The circuit according to claim 10, wherein the load is divided into inner and outer portions having an opening circles shape, the inner portion being connected to the first and second lines, the outer portion being connected to the other end portions of the first and second reactive elements.

12. The circuit according to claim 11, wherein the inner portion has a plurality of sub-portions having an open circles shape parallel connected to the first and second lines.

13. The circuit according to claim 1, wherein the first and second reactive elements respectively have a plurality of sub-reactive elements parallel connected to the second coil and the load.

14. The circuit according to claim 13, wherein the load has a plurality of portions having an open circles shape, the plurality of portions being parallel connected to the second coil through the plurality of sub-reactive elements, respectively.

15. The circuit according to claim 14, wherein the plurality of portions are coaxial.

16. The circuit according to claim 13, wherein the first and second reactive elements have 4 sub-reactive elements, respectively.

* * * * *